United States Patent
Kunimune et al.

(10) Patent No.: US 10,707,388 B2
(45) Date of Patent: Jul. 7, 2020

(54) SEMICONDUCTOR DEVICE, AND METHOD FOR MANUFACTURING SEMICONDUCTOR DEVICE

(71) Applicant: NICHIA CORPORATION, Anan-shi, Tokushima (JP)

(72) Inventors: Teppei Kunimune, Tokushima (JP); Masafumi Kuramoto, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/133,206

(22) Filed: Sep. 17, 2018

(65) Prior Publication Data
US 2019/0097102 A1  Mar. 28, 2019

(30) Foreign Application Priority Data
Sep. 27, 2017 (JP) .................. 2017-186760

(51) Int. Cl.
| H01L 33/56 | (2010.01) |
| H01L 33/52 | (2010.01) |
| H01L 23/31 | (2006.01) |
| H01L 33/48 | (2010.01) |

(52) U.S. Cl.
CPC .......... *H01L 33/56* (2013.01); *H01L 23/3121* (2013.01); *H01L 23/3142* (2013.01); *H01L 33/52* (2013.01); *H01L 33/486* (2013.01); *H01L 2924/18301* (2013.01); *H01L 2933/005* (2013.01)

(58) Field of Classification Search
CPC ....... H01L 33/52; H01L 33/56; H01L 33/486; H01L 23/3142; H01L 23/3121; H01L 2924/18301
See application file for complete search history.

(56) References Cited

U.S. PATENT DOCUMENTS

2018/0342478 A1* 11/2018 Nakako ................. H01L 24/73
2019/0206761 A1*  7/2019 Nomura ................ B29C 65/00

FOREIGN PATENT DOCUMENTS

| JP | 2002-093934 A | 3/2002 |
| JP | 2003-289117 A | 10/2003 |
| JP | 2003-338573 A | 11/2003 |
| JP | 2004-241660 A | 8/2004 |
| JP | 2005-191041 A | 7/2005 |
| JP | 2006-128229 A | 5/2006 |
| JP | 2006-156759 A | 6/2006 |
| JP | 2006-339057 A | 12/2006 |
| JP | 2007-317896 A | 12/2007 |
| JP | 2008-071869 A | 3/2008 |
| JP | 2008-084978 A | 4/2008 |
| JP | 2010-010334 A | 1/2010 |
| JP | 2011-035082 A | 2/2011 |

(Continued)

*Primary Examiner* — Joseph C. Nicely
(74) *Attorney, Agent, or Firm* — Global IP Counselors, LLP

(57) ABSTRACT

A semiconductor device includes a base, a semiconductor element mounted on the base, a porous metal sintered body and a sealing member. The porous metal sintered body is provided on the base in an area different from an area on which the semiconductor element is mounted. The sealing member covers the semiconductor element. The sealing member is placed inside the porous metal sintered body.

19 Claims, 3 Drawing Sheets

(56) References Cited

FOREIGN PATENT DOCUMENTS

| | | |
|---|---|---|
| JP | 2011-228369 A | 11/2011 |
| JP | 2013-089815 A | 5/2013 |
| JP | 2013-157392 A | 8/2013 |
| JP | 2013-183055 A | 9/2013 |
| JP | 2015-181202 A | 10/2015 |
| WO | 2006043474 A1 | 4/2006 |
| WO | 2011052672 A1 | 5/2011 |
| WO | 2011149017 A1 | 12/2011 |
| WO | 2013058024 A1 | 4/2013 |
| WO | 2017022754 A1 | 2/2017 |
| WO | 2017022755 A1 | 2/2017 |

* cited by examiner

SEMICONDUCTOR DEVICE, AND METHOD FOR MANUFACTURING SEMICONDUCTOR DEVICE

CROSS-REFERENCE TO RELATED APPLICATIONS

This application claims priority to Japanese Patent Application No. 2017-186760 filed on Sep. 27, 2017. The entire disclosure of Japanese Patent Application No. 2017-186760 is hereby incorporated herein by reference.

TECHNICAL FIELD

The present invention relates to a semiconductor device, and a method for manufacturing a semiconductor device.

BACKGROUND ART

Conventionally, in a semiconductor device such as a semiconductor light emitting device that uses a semiconductor light emitting element as a light source, or a power semiconductor device having a semiconductor element for power control, etc., a sealing resin is used to protect semiconductor elements and wiring from outside air that contains dust, moisture, etc. In a semiconductor light emitting device, among sealing resins, there are resins that contain phosphor for light conversion.

However, with a semiconductor light emitting device or a semiconductor device, the thermal stress is high due to use at high temperature and high current, and since peeling of the sealing resin from the metal plating on the lead frame or ceramic substrate occurs easily, though other characteristics are good, these cannot be used as products in some cases. Methods are known of using an anchor effect as a countermeasure for this peeling of the sealing resin from the metal.

As methods that use the anchor effect, in the contact interface of the sealing resin and the substrate surface, there is a method of making a substrate surface be a rough surface with recesses and projections (see International Patent Publication No. WO2017/022755, for example), or a method of providing holes (see Japanese Unexamined Patent Publication No. 2011-228369, for example). In addition, there are methods of curving a copper frame end surface that contacts the side surface of the sealing resin (see Japanese Unexamined Patent Publication No. 2011-035082, for example), or that forms recesses and projections on the side surface of a cavity made from molding resin (see International Patent Publication No. WO2011/052672, for example). Furthermore, there are methods in which an anchor effect can be expected in manufacturing of a composite substrate in which an electrode is formed by baking an electrically conductive paste that contains resin at a temperature that will burn away the resin component, and a ceramic substrate and a resin substrate are bonded (see Patent International Patent Publication No. WO2006/043474, for example).

SUMMARY

A semiconductor device of the present embodiment has: a base; a semiconductor element mounted on the base; a porous metal sintered body provided on the base in an area different from an area on which the semiconductor element is mounted; and a sealing member covering the semiconductor element, the sealing member being placed inside the porous metal sintered body.

A manufacturing method for a semiconductor device of the present embodiment has: mounting a semiconductor element on a base; applying a first metal powder sintering paste or second metal particles on an area of the base different from an area that the semiconductor element is mounted on, the first metal powder sintering paste containing first metal particles and a dispersion medium; applying a temperature of 160° C. to 300° C. to the first metal powder sintering paste or the second metal particles, and sintering the first metal particles or the second metal particles to form a porous metal sintered body; placing a sealing member on the base on which the porous metal sintered body is placed; and curing the sealing member after the sealing member has infiltrated to the interior of the porous metal sintered body.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DETAILED DESCRIPTION OF EMBODIMENTS

Figure 1:
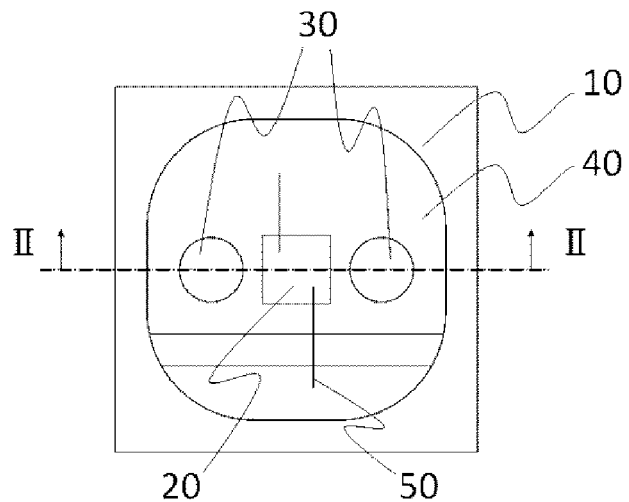
FIG. 1 is a schematic plan view showing a semiconductor device of an embodiment.
Figure 2:
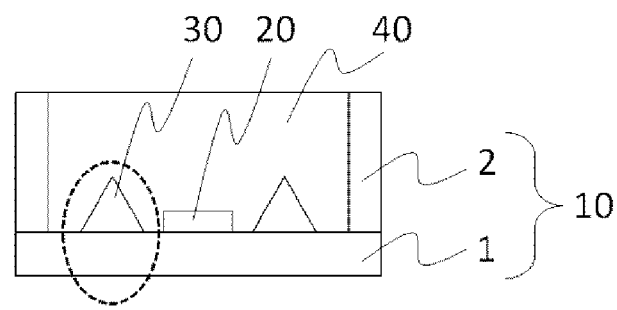
FIG. 2 is a schematic cross section view showing the semiconductor device of the embodiment, showing a cross section correlating to line II-II of FIG. 1.
Figure 3:
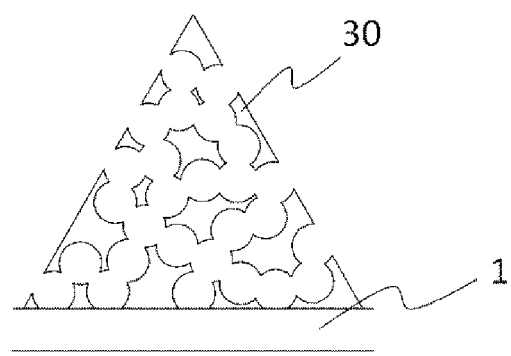
FIG. 3 is a schematic partial enlarged cross section view showing the semiconductor device of the embodiment, showing inside the dotted lines of FIG. 2.

Hereafter, a semiconductor device of the present embodiment is explained using drawings. FIG. 1 is a schematic plan view showing a semiconductor device of the embodiment. FIG. 2 is a schematic cross section view showing the semiconductor device of the embodiment, showing the cross section correlating to line II-II of FIG. 1. FIG. 3 is a schematic partial enlarged cross section view showing the semiconductor device of the embodiment, showing inside the dotted line of FIG. 2.

The drawings referenced for the following explanation are for schematically showing embodiments of the present invention, so there are cases when the scale, interval, positional relationship, etc., of the members is exaggerated, or illustration of a portion of the members may be omitted. Also, in a perspective view and cross section view thereof, there are cases when the scale or interval of the members do not match. Also, with the explanation below, as a rule, the same name and code number indicate members that are the same or of similar nature, so a detailed explanation is omitted as appropriate.

Also, in the light emitting device and the method for manufacturing that of the embodiments, "up," "down," "left," and "right," etc., may be interchanged according to circumstances. In this specification, "up," "down," etc., are items indicating the relative position between constituent elements in the drawings referenced for the explanation, and are not intended to show the absolute position unless specifically noted.

The semiconductor device of this embodiment has: a base 10; a semiconductor element 20 mounted on the base 10; a porous metal sintered body 30 provided on the base 10 of an area different from the area on which the semiconductor element 20 is mounted; and a sealing member 40 for covering the semiconductor element 20, the sealing member 40 being placed inside the porous metal sintered body 30. As a result, it is possible to prevent peeling of the sealing member 40 from the base 10. It is particularly preferable that the sealing member 40 be placed continuously from inside the porous metal sintered body 30. This is because as a result, it is possible to more strongly prevent peeling of the sealing member 40 from the base 10.

Here, being placed inside the porous metal sintered body 30 does not mean the interior of particles for which the metal sintered body 30 is hollow, but rather means that the sealing member 40 is placed inside the holes in the porous metallic body 30. Also, being placed continuously from inside the porous metal sintered body 30 means that the sealing member 40 is placed continuously from the hole interior in the porous metallic body 30 up to the top part of the semiconductor element 20.

The base 10 has a pair of leads 1 and a molded body 2 for holding the pair of leads 1. The semiconductor element 20 is electrically connected to the pair of leads 1 via an electrically conductive member 50.

The metal sintered body 30 has extremely strong adhesion with the base 10. For example, silver particles are fused to each other by sintering at 160° C. or greater using micron order silver particles, and an extremely strong metal sintered body is formed. In the sintering process, the adhesion of the base 10 and the metal sintered body 30 is also extremely good. Also, by using a metal such as copper, iron, etc., for the base 10 part on which the metal sintered body 30 is provided, it is possible to make a semiconductor device with abundant heat resistance.

The semiconductor device of this embodiment does not require implementation of processing of recesses and projections, etc., on the lead itself as was done conventionally, so it is possible to provide an inexpensive semiconductor device. Also, when recessions and projections, etc., are implemented on the lead itself as was done conventionally, there was a large burden in terms of equipment, etc., such as needing to consider adhesion and position accuracy, etc., of the lead and the resin molded body, or needing some innovations for the semiconductor element mounting, the cleaning step, etc., but with this embodiment, the burden in terms of equipment is small.

By having the metal sintered body 30 be porous, the sealing member 40 penetrates inside the hole, and by forming a fine network, it is possible to obtain a strong anchor effect, and as a result, it is possible to prevent peeling of the sealing member 40 from the base 10 due to the thermal stress, etc.

Also, by having the metal sintered body 30 be porous, it is possible to have flexibility that is strong against bending while ensuring adhesion with the base 10. Even when there is a slight bend of the base 10 due to expansion, contraction, etc., of the sealing member 40 or the base 10, it is possible to have the metal sintered body 30 adhere to the base 10 with elasticity without peeling from the base 10.

It is preferable that the maximum height of the metal sintered body 30 μm be 500 μm or less, and more preferable that the maximum height be 300 μm or less. It is possible to make bending easier by making the metal sintered body 30 small. Also, when a semiconductor light emitting element is used for the semiconductor element 20, it is possible to discharge light to the outside without blocking light emitted from the semiconductor light emitting element, and to discharge light to the outside without changing the orientation.

Also, the height of the metal sintered body 30 is preferably higher than the thickness of the light emitting element 20. This is because as a result, the stress of the sealing member 40 applied to the light emitting element 20 can be alleviated by the metal sintered body 30.

The metal sintered body 30 preferably has a conical shape. By the metal sintered body 30 having a conical shape, it is possible to form recesses and projections on the bottom surface of the base 10. Also, when using the semiconductor light emitting element, the light emitted from the semiconductor light emitting element is irradiated on the bottom surface of the base 10, and by irregular reflection increasing, it is possible to broaden the directionality of the light discharged to the outside from the semiconductor device. However, aside from the conical shape, the metal sintered body 30 can also have a polygonal cone shape, an elliptical cone shape, a truncated cone shape, an elliptical truncated cone shape, a polygonal truncated cone shape, etc.

In the plan view, preferably there is a plurality of metal sintered bodies 30 of a size from 0.005 $mm^2$ to 1 $mm^2$ on the base 10. Also, in the plan view, it is more preferable that there be a plurality of the metal sintered bodies 30 of size 0.01 $mm^2$ to 0.5 $mm^2$ on the base 10. By using this kind of the metal sintered body 30, it is possible to have strong bonding of the base 10 and the sealing member 40 without making the base 10 large. The number of metal sintered bodies 30 can be one or can be a plurality of two or more. When there is a plurality of metal sintered bodies 30, it is preferable that the distance from the semiconductor element 20 be at even intervals. This is because that makes it possible to have uniform heat radiation of the heat from the semiconductor element 20. For example, it is possible to place the metal sintered bodies 30 so as to be the peak points of regular polygons on a diagonal line with respect to the semiconductor element 20. This is because when using the semiconductor light emitting element, it is possible to control not just heat radiation, but also the directionality of the light.

In the plan view, with respect to the area of the base 10 covered by the sealing member 40, it is preferable that the metal sintered body 30 have an area of 4% to 50%, more preferably an area of 5% to 40%, and particularly preferably an area of 10% to 30%. By using this kind of relationship of the metal sintered body 30 and the base 10, it is possible to have strong bonding of the base 10 and the sealing member 40 without making the base 10 larger. Here, when the base 10 has a recess, the area uses the inner bottom surface of the recess of the base 10 as a reference. When the base 10 does not have a side wall, the area of the outermost shell at which the sealing member 40 and the base 10 are in contact is used as a reference.

Metal Sintered Body

The metal sintered body of this embodiment can be obtained by baking a metal powder sintering paste. The metal sintered body is porous.

The diameter of the porous holes is preferably 0.1 μm to 3 μm. Using items of particle diameter 0.3 μm to 5 μm, there is overall contraction due to sintering, but since the entire particles do not melt, holes of approximately 0.1 µm to 3 µm are formed. If the porous holes are large, it is easier for the metal sintered body itself to break. On the other hand, if the porous holes are small, an air layer is interposed without infiltration of the sealing member, and there is a decrease in bonding strength. For that reason, it is preferable to have a hole diameter with which the sealing member can infiltrate easily.

It is preferable that the porous holes be irregular. By making the porous holes irregular, it is possible to suppress peeling and distortion in a specific direction.

There are cases when rather than even sized porous holes being placed uniformly, the holes may be linked. By porous holes being linked, it is possible to make it easier for the sealing member to infiltrate.

The metal sintered body can be an item for which only metal powder is sintered, but it is preferable to be an item for which a metal powder sintering paste for which a metal powder is dispersed in a dispersion medium is sintered. The metal powder sintering paste has metal fine particles as the main component. As the dispersion medium, it is preferable to have boiling point of 100° C. to 400° C., and volatilize when the metal fine particles are sintered, resulting in that the dispersion medium does not remain. As the dispersion medium, it is preferable to use an item that is substantially free of resin. By using such a dispersion medium, sintering of metal powders to each other is promoted, and it is possible to improve electrical conductivity and heat radiation. There is organic solvent, etc., in the dispersion medium, but this is not particularly restricted. When an organic solvent is used, the organic solvent is volatilized by heating, and by the metal fine particles being sintered to each other thereafter, a porous sintered body is formed.

The metal fine particles used for the metal powder sintering paste preferably have silver particles as a main component. Specifically, this means that the content of silver particles in the metal fine particles is, for example, 70 mass % or greater, preferably 80 mass % or greater, and even more preferably 90 mass % or greater. It is also possible to contain particles of silver oxide in the silver particles at, for example, 10 mass % or less, preferably 7 mass % or less, and more preferably 5 mass % or less. Also, it is possible to contain a metal other than silver, such as particles of a metal of gold, platinum, copper, aluminum, iron, etc., or particles of an inorganic substance such as ceramics, at 20 weight % or less, preferably 10 weight % or less, and more preferably 5 weight % or less. This is because it is possible to prevent silver migration, and to change the electrical conductivity, light reflectivity, glossiness, etc. This is because if silver particles are contained in the metal powder sintering paste at a designated ratio, fusion of the silver particles occurs, and it is possible to ensure adhesion with the base. Also, though silver particles contribute to fusion, particles other than silver do not contribute to fusion, so it is possible to control empty holes.

The silver particles can be used with the average particle diameter being one type, or a mixture of two or more types. For the silver particles, the average particle diameter is 0.3 µm to 5 µm, preferably 1.0 µm to 4 µm, and more preferably 1.5 µm to 3.5 µm. As a result, it is possible to form a sintered body at low temperature, and possible to have a porous structure for which it is easy for the sealing member to penetrate. For the metal particles other than silver particles, it is possible to use items with the average particle diameter of 0.1 µm to 15 µm, but it is preferably 0.3 µm to 10 µm, and more preferably 0.3 µm to 5 µm.

For the silver particles, the content of particles at particle diameter of less than 0.3 µm is preferably 5 mass % or less, and more preferably 4 mass % or less.

For the silver particles, the content of particles at particle diameter of 0.5 µm or less is preferably 15 mass % or less, and more preferably 10 mass % or less.

The average particle diameter of the silver particles can be measured using the laser diffraction method. The average particle diameter means the value for which the cumulative deposition frequency is 50% found from the particle size distribution. Following, the average particle diameter means the median diameter unless specifically noted otherwise.

Also, with the silver particles, the specific surface area is 0.4 m$^2$/g to 1.5 m$^2$/g, preferably 0.6 m$^2$/g to 0.9 m$^2$/g, and more preferably 0.66 m$^2$/g to 0.74 m$^2$/g. As a result, it is possible to enlarge the bonding area of adjacent silver particles, and since the rise in viscosity due to addition of the silver particles is small, it is possible to include a large number of silver particles in the paste. As a result, the occurrence of voids is suppressed, and a high bonding strength can be obtained. The specific surface area of the silver particles which is the main raw material of the metal powder sintering paste can be measured using the BET method.

The form of the silver particles is not limited, but examples include a spherical shape, a flat shape, a flake form, a polyhedron, etc., and a flake form is preferable. The reason for using a flake form is that the contact area of adjacent silver particles is larger, and the sintering temperature can be lowered. The form of the silver particles is preferably equal in regards to silver particles for which the average particle diameter is within a designated range. When mixing silver particles for which there are two or more types of average particle diameter mixed, the form of the silver particles of the respective average particle diameters can be the same or can be different. For example, when mixing two or more types of silver particles for which the average particle diameter is 3 µm and silver particles of average particle diameter 0.3 µm, the silver particles for which the average particle diameter is 0.3 µm can have a spherical shape, and the silver particles for which the average particle diameter is 3 µm can have a flat shape.

The content of the silver particles with respect to the paste is preferably 70 mass % or greater, more preferably 85 mass % or greater, and even more preferably 90 mass % or greater. This is because when the content of the silver particles is within a designated range, the bonding strength to the electrode is higher.

An anionic surfactant may also be contained in the metal powder sintering paste. Using an anionic electric field, for an electrode of silver or gold typically having a minus surface potential, by an anionic surfactant exhibiting resistance to bleeding due to the electric field, it is possible to manufacture a stable electronic component for which the wire bond defect due to leakage or contamination to the electrode on the base is improved.

The surfactant preferably has high volatility. In specific terms, when the temperature rises by 2° C. per minute from near room temperature in TG-DTA (differential thermal and thermogravimetric simultaneous analysis), it is preferable to use an item for which the residue at the point of 350° C. is 20 mass % or less, and more preferably an item for which it is 5 mass % or less. This is because if the residue is 20 mass % or less, since the volatilization residue during baking does not alienate sintering, the bonding strength increases.

The anionic surfactant preferably is a carboxylic acid type containing a carboxyl group or a salt thereof, and preferably is a carboxylic acid type represented by formula (I) hereafter.

$$R^1O(CH_2CH(R^2)O)_{n1}CH_2COOR^3 \quad (I)$$

(In the formula, $R^1$ is a C7 or greater straight chain or branched alkyl group, $R^2$ is any of —H, —CH$_3$, —CH$_2$CH$_3$, or —CH$_2$CH$_2$CH$_3$, $R^3$ is —H or an alkali metal, and n1 is a range from 2 to 5.)

Also, it is preferable that the anionic surfactant be of the carboxylic acid type represented by formula (II) hereafter.

$$R^{11}—C(O)N(R^{12})(CH_2)_{n2}COOR^{13} \quad (II)$$

(In the formula, $R^{11}$ is a C7 or greater straight chain or branched alkyl group, $R^{12}$ is any of —H, —CH$_3$, —CH$_2$CH$_3$, or —CH$_2$CH$_2$CH$_3$, $R^{13}$ is —H, NH+(C$_2$H$_4$OH)$_3$, or an alkali metal, and n2 is a range from 1 to 5.)

Also, it is preferable that the anionic surfactant be of the carboxylic acid type represented by formula (III) hereafter.

$$R^{21}—CH=CH—(CH_2)_{n3}COOR^{22} \quad (III)$$

(In the formula, $R^{21}$ is a C7 or greater straight chain or branched alkyl group, $R^{22}$ is —H or an alkali metal, and n3 is a range from 1 to 10.)

Also, it is preferable that the anionic surfactant be of the carboxylic acid type represented by formula (IV) hereafter.

$$R^{31}—COOR^{32} \quad (IV)$$

(In the formula, $R^{31}$ is a C7 or greater straight chain or branched alkyl group or alkoxy group optionally substituted with OH or COOR$^{33}$ (R$^{33}$ is an alkali metal), and $R^{32}$ is —H or an alkali metal.)

Also, the anionic surfactant is preferably a sulfonic acid type containing a sulfo group or a salt thereof, and more preferably is a sulfonic acid type represented by formula (V) hereafter.

$$R^{41}—SO_3R^{42} \quad (V)$$

(In the formula, $R^{41}$ is a C7 or greater straight chain or branched alkyl group, aralkyl group, or alkenyl group optionally substituted with OH or COOR$^{43}$ (R$^{43}$ is an alkyl group), or an aralkyl group, and $R^{42}$ is —H or an alkali metal.)

Also, the anionic surfactant is preferably a carboxyl-sulfonic acid type containing both a carboxyl group or a salt thereof, and a sulfo group or a salt thereof, and more preferably the carboxyl-sulfonic acid type represented by formula (VI) hereafter.

$$R^{51}—(CH_2CH_2O)_{n5}—CO—(CH_2)_{n6}—CH(—(CH_2)_{n7}—COOR^{53})—SO_3R^{52} \quad (VI)$$

(In the formula, $R^{51}$ is a C7 or greater straight chain or branched alkoxy group, or $R^{54}$—CONH— ($R^{54}$ is a C7 or greater straight chain or branched alkyl group), $R^{52}$ and $R^{53}$ are —H or an alkali metal, n5 is a range of 1 to 8, n6 is a range from 0 to 1, and n7 is a range from 0 to 1.

Also, the anionic surfactant preferably is a phosphate ester type of a phosphate ester structure or a salt thereof, and more preferably is a phosphate ester type represented by formula (VII) hereafter.

$$R^{61}—O—PO(OR^{62})OR^{63} \quad (VII)$$

(In the formula, $R^{61}$ and $R^{62}$ are straight chain or branched alkyl groups, and $R^{63}$ is —H or an alkali metal.)

For the content of the surfactant, the upper limit is preferably 10 mass % with respect to the metal powder sintering paste of the present embodiment. Also, the content of the surfactant is preferably 2 mass % or less with respect to the sintering type bonding material. That is because it is possible to volatilize completely by baking.

The surfactant is preferably in liquid form at 25° C. This is because the solid content in the paste can be minimized, so it is possible to include a large amount of metal fine particles, and voids do not occur easily in the obtained sintered body.

The metal powder sintering paste may also include an organic solvent as the dispersion medium. This is because by evenly dispersing the silver particles in the organic solvent, it is possible to do high quality application efficiently using a technique of printing or dispensing.

The dispersion medium can be a single type of organic solvent, or can be a mixture of two or more types of organic solvent, and it is preferable to be a mixture of a diol and an ether. This is because it is possible to form a sintered body at low temperature using a metal powder sintering paste that uses this kind of dispersion medium.

It is preferable that the boiling point of the dispersion medium be 400° C. or less, and more preferably that it be 150° C. to 300° C. This is because when the boiling point of the dispersion medium is 150° C. to 300° C., the viscosity change at room temperature of the metal powder sintering paste due to volatilization of the dispersion medium can be suppressed, so workability is good. Furthermore, when the boiling point of the dispersion medium is in the above range, the dispersion medium can be completely volatilized by baking.

Examples of the diol include aliphatic diols such as ethylene glycol, 1,3-propanediol, 1,4-butanediol, diethylene glycol, 1,5-pentanediol, 1,6-hexanediol, dipropylene glycol, triethylene glycol, tetraethylene glycol, 1,2-propanediol, 1,3-butanediol, 2,3-butanediol, neopentyl glycol (2,2-dimethylpropane-1,3-diol), 1,2-hexanediol, 2,5 hexanediol, 2-methyl-2,4-pentanediol, 3-methyl-1,3-pentanediol, and 2-ethyl-1,3-hexanediol; 2,2-bis(4-hydroxycyclohexyl) propane, an alkylene oxide adduct of 2,2,-bis(4-hydroxycyclohexyl) propane; and alicyclic diols such as 1,4-cyclohexanediol, 1,4-cyclohexanedimethanol and the like.

Examples of the ether include dipropylene glycol methyl ether, tripropylene glycol methyl ether, propylene glycol n-propyl ether, dipropylene glycol n-propyl ether, propylene glycol n-butyl ether, dipropylene glycol n-butyl ether, propylene glycol phenyl ether, dipropylene glycol dimethyl ether, 1,3-dioxolane, ethylene glycol monobutyl ether, diethylene glycol monoethyl ether, diethylene glycol monobutyl ether, ethylene glycol monoethyl ether and the like.

When the dispersion medium is a mixture of diol and ether, the mass ratio of the diol and ether is preferably diol:ether=7 to 9:2. This is because it is possible to form a metal sintered body at low temperature using a metal powder sintering paste that uses this kind of organic solvent mixture.

The dispersion medium content is not particularly limited because the required viscosity changes according to the application method of the metal powder sintering paste. To suppress porosity of the sintered body obtained by baking the metal powder sintering paste, it is preferable that 30 mass % be the upper limit for the dispersion medium content with respect to the metal powder sintering paste.

Base

The base is not particularly limited, and for example can be a wiring substrate such as a printed wiring substrate, a lead frame, a submount, a copper clad ceramic substrate, etc. As the wiring substrate, examples include a ceramic substrate containing aluminum oxide, aluminum nitride, zirconium oxide, zirconium nitride, titanium oxide, titanium nitride or a mixture of these, a metal substrate containing Cu, Fe, Ni, Cr, Al, Ag, Au, Ti, or an alloy of these, a glass substrate, a resin substrate such as a BT resin substrate, and a glass epoxy substrate, etc. The wiring substrate and the lead frame can also be items configuring a portion of the package for manufacturing the semiconductor device. As the lead frame, examples include items that contain Cu, Fe, Ni, Cr, Al, Ag, Au, Ti, or alloys of these. When the base surface is configured using a metal that easily oxidizes such as copper, etc., there are cases when an oxide film is formed on the surface of the base, and by the existence of this oxide film, there is the risk of the bonding strength of the base and the semiconductor element decreasing. In contrast to this, prior to bonding in an oxidizing atmosphere, heating is performed in a reducing atmosphere. By heating in the reducing atmosphere, the oxide film of the substrate surface is reduced and removed. As a result, it is possible to increase the bonding strength of the base and the electronic component.

It is preferable that the base have a base material that uses copper or a copper alloy as a main component. By using such a base, it is possible to increase the electrical conductivity and the heat radiating properties of the semiconductor device.

It is preferable that the base be plated using silver, gold, aluminum, or an alloy containing these as a main component. By using such a base, it is possible to prevent a rise in the electric resistance caused by alloying, oxidation, etc. due to heat.

Semiconductor Element

As the semiconductor element, for example, it is possible to use a semiconductor element such as an insulated gate bipolar transistor (IGBT) element, a metal oxide film field effect transistor (MOSFET) element, a light emitting diode (LED) element, a free wheeling diode (FWD) element, a giant transistor (GTR) element, etc. The semiconductor element is preferably a semiconductor light emitting element, for example a light emitting diode or laser diode. As the semiconductor light emitting element, it is possible to use an item of any wavelength, but it is preferable to use a nitride semiconductor light emitting element that emits blue light.

Sealing Member

The type of sealing member is not particularly limited, but, for example, it is preferably at least one type selected from the group consisting of epoxy resin, silicone resin, modified epoxy resin, modified silicone resin, and unsaturated polyester resin. This is because particularly in the case of epoxy resin, there is excellent performance in terms of fluidity, heat resistance, moisture resistance, strength, etc.

The sealing member must have fluidity during softening, and is preferably a thermosetting resin. This is because thermosetting resin is high in fluidity compared to thermoplastic resin. The melt viscosity of the sealing member is preferably 1 Pa·s or less. This is because by lowering the melt viscosity, it is possible for the sealing member to infiltrate into the porous metal sintered body. It is also because it is possible to increase discharging of air that accompanies infiltration by the sealing member.

It is also possible to have the sealing member contain a filler. It is preferable that the filler have a specific gravity close to that of the sealing member, or that it have a smaller specific gravity than that of the sealing member. This is because when the specific gravity of the filler is smaller than that of the sealing member, the filler does not enter the holes of the metal sintered body. Also, by having the specific gravity of the filler be smaller than that of the sealing member, it is possible to broaden the light diffusion by increasing the density of the filler near the boundary surface of the sealing member.

In addition, specific materials that can be used as an electrically conductive member include a eutectic solder of a metal such as copper, aluminum, gold, silver, tungsten, iron, nickel, cobalt, etc., or of an iron-nickel alloy, phosphor bronze, copper-containing iron, molybdenum, Au—Sn, etc., a solder of SnAgCu, SnAgCuIn, etc., ITO, etc.

Method for Manufacturing a Semiconductor Device

Next, the method for manufacturing a semiconductor device of the present embodiment is explained.

The method for manufacturing a semiconductor device has: a step for mounting a semiconductor element 20 on a base 10; a step for, on the base 10 of an area that is different from the area that the semiconductor element 20 is mounted on, applying a first metal powder sintering paste that contains first metal particles and a dispersion medium, or second metal particles; a step for applying a temperature of 160° C. to 300° C. to the first metal powder sintering paste or the second metal particles, and sintering the first metal particles or the second metal particles; a step for placing a sealing member 40 on the base 10 on which is placed a porous metal sintered body 30 for which the first metal particles or the second metal particles are sintered; and a step for curing the sealing member 40 after the sealing member 40 has infiltrated to the interior of the metal sintered body 30.

Following is a detailed description of each step.

There is a step for mounting the semiconductor element 20 on the base 10. The step of mounting the semiconductor element 20 on the base 10 can be face up mounting of the semiconductor element 20 on the base 10 using an adhesive agent, or can be face down mounting of the semiconductor element 20 on the base 10 using an electrically conductive adhesive agent or solder. For the adhesive agent or electrically conductive adhesive agent used at this time, it is possible to use the metal powder sintering paste used with the metal sintered body. For example, it is possible to apply a second metal powder sintering paste on the base 10, and to mount the semiconductor element 20 on the second metal powder sintering paste. The step for mounting the semiconductor element 20 on the base 10 may be final mounting or may be temporary placement. Also, in the step for sintering the first metal powder sintering paste and the second metal particles, it is possible to also simultaneously perform mounting of the semiconductor element. This is because by doing this, it is possible to reduce the heat burden on the base.

There is a step for applying the first metal powder sintering paste that contains first metal particles and a dispersion medium, or, second metal particles, on the base 10 of an area different from the area in which the semiconductor element 20 is mounted. The different area indicates an area on which the semiconductor element 20 does not overlap in the plan view. However, the first metal powder sintering paste may be continuously connected with the second metal powder sintering paste used as the adhesive agent of the semiconductor element 20, but items that function only as an adhesive agent are excluded. For example, the first metal powder sintering paste may be an item separated from the semiconductor element 20 by at least or more the size of the semiconductor element 20, or an item having a hollow in the plan view between the first metal powder sintering paste and the second metal powder sintering paste.

This step for applying and the step for mounting can be in any sequence, and can also be simultaneous. Simultaneous means using the first metal powder sintering paste or the second metal particles as the adhesive agent used when mounting the semiconductor element on the base, applying on the base in a short period the first metal powder sintering paste or the second metal particles as the adhesive agent and the first metal powder sintering paste or the second metal particles as the metal sintered body, and thereafter, the semiconductor element is mounted on the base to which the adhesive agent is applied.

Compared to using only the second metal particles, by using the first metal powder sintering paste, workability is improved. When using only the second metal particles, there is labor involved in measuring the amount and adjusting the application amount, but by using the first metal powder sintering paste, it is possible to make adjustment of the application amount, transport, etc., easy.

It is preferable that the first metal particles and the second metal particles use silver as the main component. This is because though silver has a melting point of 962° C., by applying a temperature of 160° C. or greater in an atmosphere containing oxygen, silver particles fuse to each other.

Before the application step, it is preferable that the base be plated using silver, gold, aluminum, or an alloy containing these as a main component. This is because by doing this, the adhesion with the first metal particles or the second metal particles improves. In particular, when using silver for the first metal particles or the second metal particles, it is preferable that the base be plated using silver. This is because by using silver for these, there is a remarkable improvement in adhesion of the first metal particles and the second metal particles with the silver of the base. This is also because when using a semiconductor light emitting element that emits visible light for the semiconductor element, it is possible to increase the reflection rate for reflecting light from the semiconductor light emitting element.

The method for applying the first metal powder sintering paste and the second metal particles on the base is not particularly limited, but examples include a stamping method, a dispensing method, a printing method, etc., and the stamping method is preferable. By using the stamping method, it is possible to do application with good precision in a small application diameter.

The application shape of the first metal powder sintering paste is preferably a conical shape. This is because by using a conical shape, it is possible to do formation with good precision in a smaller application diameter.

There is a step for applying a temperature of 160° C. to 300° C. to the first metal powder sintering paste or the second metal particles, and sintering the first metal particles or the second metal particles.

Baking is preferably performed at a temperature in a range of 160° C. to 300° C. This is because when baking is done in this temperature range, it is possible to avoid heat degradation of the base on which the semiconductor element, etc., is mounted. Also, it is more preferable that the baking be performed at a temperature in a range of 160° C. to 260° C., and even more preferable that it be performed at a temperature in a range of 170° C. to 195° C. This is because the lead frame for which an adhesive agent that contains a conventional resin is assumed includes members that degrade at 200° C. or greater.

Baking can be performed, for example, for 10 minutes to 180 minutes, and preferably from 30 minutes to 120 minutes.

The step for baking is preferably done in an oxygen atmosphere or in an air atmosphere. This is because when in an oxygen atmosphere or an air atmosphere, diffusion of silver is promoted, and the bonding of the base and the metal sintered body is strong.

For the step for sintering, it is preferable that the dispersion medium in the first metal powder sintering paste be removed. This is because by removing the dispersion medium in the first metal powder sintering paste, the first metal particles are arranged in the oxygen atmosphere or the air atmosphere, and sintering is promoted.

There is a step for mounting the sealing member 40 on the base 10 on which is mounted the porous metal sintered body 30 for which the first metal particles or the second metal particles are sintered.

Next, there is a step for curing the sealing member after the sealing member has infiltrated to the interior of the metal sintered body.

The sealing step is not particularly limited, and it is possible to use a potting method, a dispensing method, a transfer mold method, etc. By sealing, protection from the outside air is implemented for the semiconductor element and the wiring. In the sealing step, by the sealing member passing through the holes of the metal sintered body and infiltrating to the interior and then doing curing, there is strong bonding of the sealing member and the base. Also, this bonding does not include the resin, so there is little degradation due to heat.

The placement of the sealing member is preferably done with removal of air included in the holes of the metal sintered body, so it is preferable to place the sealing member while ensuring a pathway for air to escape.

The semiconductor light emitting device is one mode of the semiconductor device.

WORKING EXAMPLES

Following, based on working examples and a comparison example, the method for bonding the metal sintered body and the method for manufacturing a bonded body is explained to evaluate the adhesion of the metal sintered body and the sealing member, etc.

Working Example 1

A lead frame is used as the base. On the lead frame which made of copper as the base material and nickel (1.0 μm thick), palladium (0.04 μm thick), and gold (0.006 μm thick) as the surface plated layer, a silicone rubber sheet having a hole shape, and having releasability on the bottom surface was adhered.

As the dispersion medium, 2-ethyl-1,3-hexanediol (28.72 g) and diethylene glycol monobutylether (7.18 g) that are organic solvents were stirred for 30 seconds using a rotating/revolving mixer (product name Awatori Rentaro AR-500, made by Thinky Corp.), and a solvent mixture was obtained.

Flake form silver particles (made by Fukuda Metal Foil & Powder Co., Ltd., product name AgC-239, flake form, average particle diameter 2.6 μm, specific surface area 0.7 $m^2$/g, less than 0.3 μm particle diameter particle content 2 mass %, 0.5 μm or less particle diameter particle contents 6 mass %, 459.50 g) were measured and added to the solvent mixture. The obtained mixture was stirred using one cycle of a cycle of three minutes of stirring and two minutes of defoaming using a rotating/revolving mixer (product name Awatori Rentaro AR-500, made by Thinky Corp.), and the metal powder sintering paste (500 g) was obtained. The content of the silver particles was 91.9 mass %.

The obtained metal powder sintering paste was applied to opening of the silicone rubber sheet on the lead frame using an air dispenser. Using a 24 G needle, using back pressure 300 kPa, discharge time 1.1 seconds, two points each were applied to one opening. Thereafter, using an atmosphere oven, baking was done for 1 hour at 185° C., and the metal sintered body bonded to the gold plated surface was obtained. Thereafter, for surface purification, using argon gas, plasma cleaning was implemented on the lead frame for 4 seconds at 100 W.

Epoxy resin was used as the sealing member. The main agent (5.00 g) of the epoxy resin (model number: H2008-9B) and the curing agent (2.75 g) were stirred for 3 minutes using a rotating/revolving mixer (product name Awatori Rentaro AR-500, made by Thinky Corp.), and the sealing resin was obtained. This was applied using an air dispenser so that the opening of the silicone rubber sheet on the lead frame was filled, and after raising the temperature to 120° C. and holding for one hour, the temperature was raised over 20 minutes to reach 150° C., and curing was done by holding for three hours. Thereafter, the silicone rubber sheet was peeled from the lead frame, and the sealing resin cured material bonded to the lead frame was obtained.

Working Example 2

Other than the application of the metal powder sintering paste at five points on one opening, this was performed the same as with working example 1, and the sealing resin cured material bonded to the lead frame was obtained.

Working Example 3

Other than the application of the metal powder sintering paste to nine points on one opening, this was performed the same as the working example 1, and the sealing resin cured material bonded to the lead frame was obtained.

Comparison Example 1

Other than implementing plasma cleaning after adhering the silicone rubber sheet and advancing to the sealing resin application without performing the application of the metal powder sintering paste, this was performed the same as with the working example 1, and the sealing resin cured material bonded to the lead frame was obtained.

In regards to the obtained sealing resin cured material, a confirmation was done for the occurrence rate of items for which peeling had already occurred. Furthermore, the area ratio of the metal sintered body to the scaling resin was confirmed from the external appearance, and then, shearing force was applied in the peeling direction of the sealing resin cured material from the lead frame, and the strength when peeling was measured as the sealing resin adhesion strength.

Table 1 shows the measurement results of the metal sintered body area ratio, the peeling occurrence rate after sealing, and the sealing resin adhesion strength for working examples 1 to 3 and comparative example 1.

Figure 4:
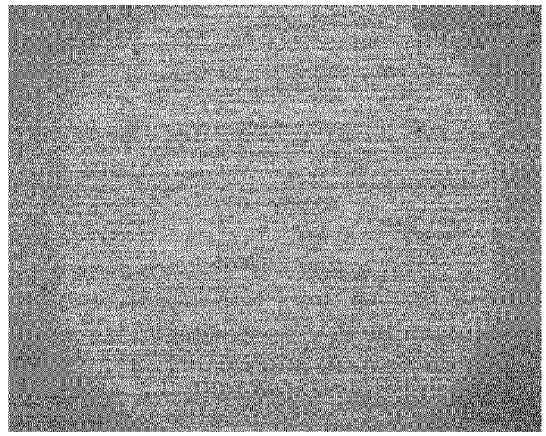
FIG. 4 is an optical microscope photograph showing the external appearance after peeling of working example 1.
Figure 5:
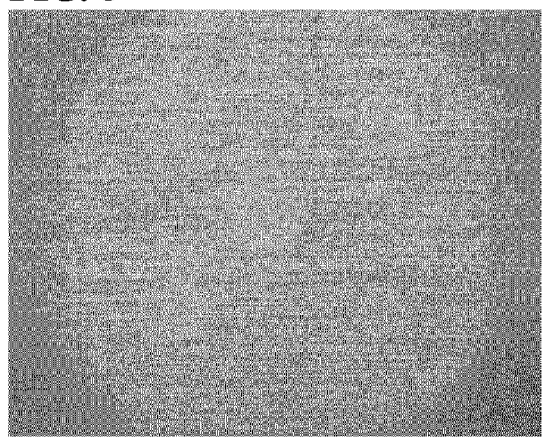
FIG. 5 is an optical microscope photograph showing the external appearance after peeling of working example 2.
Figure 6:
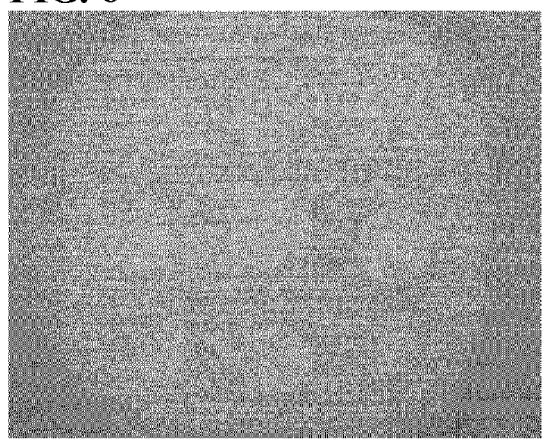
FIG. 6 is an optical microscope photograph showing the external appearance after peeling of working example 3.
Figure 7:
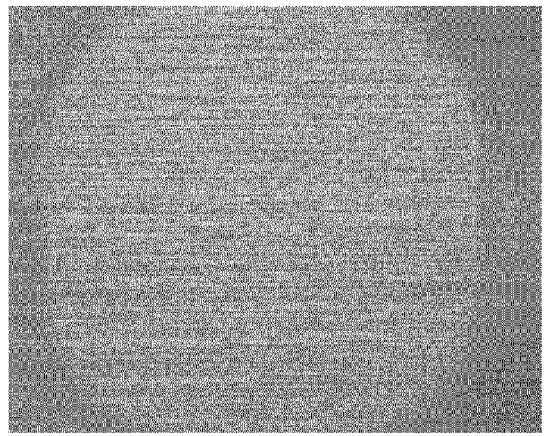
FIG. 7 is an optical microscope photograph showing the external appearance after peeling of comparison example 1.
Figure 8:
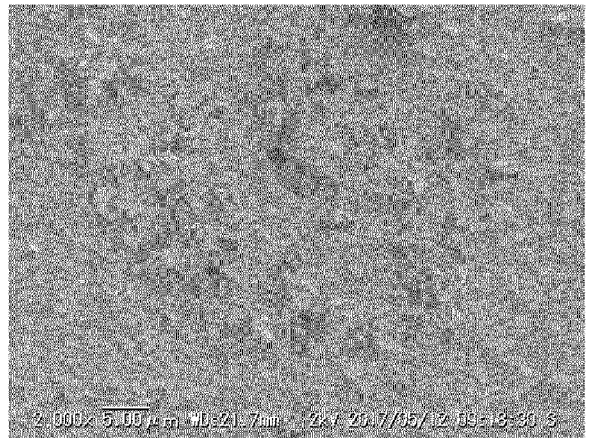
FIG. 8 is an SEM photograph that captures the center of the broken part of the metal sintered body of working example 2.

FIG. 4 is an optical microscope photograph showing the external appearance after peeling for working example 1. FIG. 5 is an optical microscope photograph showing the external appearance after peeling for the working example 2. FIG. 6 is an optical microscope photograph showing the external appearance after peeling for the working example 3. FIG. 7 is an optical microscope photograph showing the external appearance after peeling for the comparative example 1. FIG. 8 is an SEM photograph that captures the metal sintered body cut part center for the working example 2.

TABLE 1

|  | Working Example 1 | Working Example 2 | Working Example 3 | Comparative Example 1 |
| --- | --- | --- | --- | --- |
| Metal sintered body area ratio (%) | 4 | 11 | 19 | 0 |
| Occurrence rate of peeling after sealing (%) | 0 | 0 | 0 | 40 |
| Sealing resin adhesion strength (gf) | 2037 | 2772 | 3820 | 836 |

From these measurement results, peeling after sealing was suppressed by forming the metal sintered body. Also, the adhesion strength also rose along with the area ratio of the metal sintered body. Also, as shown in FIG. 8, sealing resin that looks black even inside the sintered body was confirmed, and it was understood that the sealing resin passed through the holes of the metal sintered body, infiltrated to the inside, and was cured. An anchor effect was obtained as a result of this.

The semiconductor device and the method for manufacturing the semiconductor device of this embodiment can be applied to manufacturing of a semiconductor device including a power semiconductor, etc., for example. Also, semiconductor device and the method for manufacturing the semiconductor device of this embodiment can be also applied when manufacturing a semiconductor light emitting device using a semiconductor light emitting element such as an LED, an LD, etc., for example.

What is claimed is:

1. A semiconductor device comprising:
    a base;
    a semiconductor element mounted on the base;
    a porous metal sintered body provided on the base in an area different from an area on which the semiconductor element is mounted, the metal sintered body having silver as a main component; and
    a sealing member covering the semiconductor element, the sealing member being placed inside the porous metal sintered body.

2. The semiconductor device according to claim 1, wherein
    the base has a base material with copper or a copper alloy as a main component.

3. The semiconductor device according to claim 1, wherein
    the base is plated with silver, gold, aluminum, or an alloy containing one or more of silver, gold and aluminum as a main component.

4. The semiconductor device according to claim 1, wherein
    the metal sintered body has a conical shape.

5. The semiconductor device according to claim 1, further comprising
    an additional metal sintered body, and
    each of the metal sintered body and the additional metal sintered body has a size of 0.005 mm$^2$ to 1 mm$^2$ in a plan view.

6. The semiconductor device according to claim 1, wherein
in a plan view, with respect to an area of the base covered by the sealing member, the metal sintered body occupies an area of 4% to 50%.

7. The semiconductor device according to claim 1, wherein
the sealing member is at least one type selected from the group consisting of epoxy resin, silicone resin, modified epoxy resin, modified silicone resin, and unsaturated polyester resin.

8. The semiconductor device according to claim 1, wherein
the semiconductor element is a semiconductor light emitting element.

9. A manufacturing method for a semiconductor device, comprising:
mounting a semiconductor element on a base;
applying a first metal powder sintering paste or second metal particles on an area of the base different from an area that the semiconductor element is mounted on, the first metal powder sintering paste containing first metal particles and a dispersion medium;
applying a temperature of 160° C. to 300° C. to the first metal powder sintering paste or the second metal particles, and sintering the first metal particles or the second metal particles to form a porous metal sintered body;
placing a sealing member on the base on which the porous metal sintered body is placed; and
curing the sealing member after the sealing member has infiltrated to an interior of the porous metal sintered body.

10. The manufacturing method of a semiconductor device according to claim 9, wherein
the first metal particles and the second metal particles have silver as the main component.

11. The manufacturing method for a semiconductor device according to claim 9, wherein
the first metal powder sintering paste is substantially free of resin.

12. The manufacturing method for a semiconductor device according to claim 9, wherein
the sintering of the first metal particles includes removing the dispersion medium in the first metal powder sintering paste.

13. The manufacturing method for a semiconductor device according to claim 9, wherein
the sintering of the first metal particles is performed in an oxygen atmosphere or an air atmosphere.

14. The manufacturing method for a semiconductor device according to claim 9, wherein
before the applying of the first metal powder sintering paste or the second metal particles on the base, plating the base with silver, gold, aluminum, or an alloy containing one or more of silver, gold and aluminum as a main component.

15. A semiconductor device comprising:
a base having a base material with copper or a copper alloy as a main component;
a semiconductor element mounted on the base;
a porous metal sintered body provided on the base in an area different from an area on which the semiconductor element is mounted; and
a sealing member covering the semiconductor element, the sealing member being placed inside the porous metal sintered body.

16. The semiconductor device according to claim 15, wherein
the base is plated with silver, gold, aluminum, or an alloy containing one or more of silver, gold and aluminum as a main component.

17. A semiconductor device comprising:
a base that is plated with silver, gold, aluminum, or an alloy containing one or more of silver, gold and aluminum as a main component;
a semiconductor element mounted on the base;
a porous metal sintered body provided on the base in an area different from an area on which the semiconductor element is mounted; and
a sealing member covering the semiconductor element, the sealing member being placed inside the porous metal sintered body.

18. The semiconductor device according to claim 17, wherein
in a plan view, with respect to an area of the base covered by the sealing member, the metal sintered body occupies an area of 4% to 50%.

19. The semiconductor device according to claim 17, wherein
the semiconductor element is a semiconductor light emitting element.

* * * * *